(12) United States Patent
Liu

(10) Patent No.: US 9,771,259 B2
(45) Date of Patent: *Sep. 26, 2017

(54) METHOD FOR FABRICATING ELECTRONIC DEVICE PACKAGE

(71) Applicant: XINTEC INC., Taoyuan (TW)

(72) Inventor: Chien-Hung Liu, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/932,814

(22) Filed: Nov. 4, 2015

(65) Prior Publication Data

US 2016/0052782 A1   Feb. 25, 2016

Related U.S. Application Data

(62) Division of application No. 12/652,715, filed on Jan. 5, 2010, now Pat. No. 9,181,084.

(Continued)

(51) Int. Cl.
| | |
|---|---|
| *B81C 1/00* | (2006.01) |
| *H01L 21/683* | (2006.01) |
| *H01L 23/00* | (2006.01) |

(52) U.S. Cl.
CPC ...... *B81C 1/00325* (2013.01); *B81C 1/00301* (2013.01); *H01L 21/6835* (2013.01); *H01L 24/05* (2013.01); *B81B 2207/092* (2013.01); *B81B 2207/097* (2013.01); *B81C 2201/0115* (2013.01); *B81C 2203/0118* (2013.01); *H01L 24/11* (2013.01); *H01L 24/13* (2013.01); *H01L 24/29* (2013.01); *H01L 24/32* (2013.01); *H01L 24/83* (2013.01); *H01L 24/93* (2013.01); *H01L 2221/6834* (2013.01);

(Continued)

(58) Field of Classification Search
CPC ........ B81C 2203/01; B81C 2203/0136; B81C 2203/0154; B81C 2203/0118; B81C 1/00261–1/00293; B81C 1/00325; H01L 23/49805; H01L 2924/1461

See application file for complete search history.

(56) References Cited

U.S. PATENT DOCUMENTS

| | | |
|---|---|---|
| 6,278,167 B1 | 8/2001 | Bever et al. |
| 6,383,832 B1 | 5/2002 | Nakabayashi |
| | (Continued) | |

FOREIGN PATENT DOCUMENTS

| | | |
|---|---|---|
| CN | 101236938 | 8/2008 |
| CN | 101249936 | 8/2008 |
| | (Continued) | |

OTHER PUBLICATIONS

English machine translation of CN 101249936 to Yang et al.

*Primary Examiner* — Laura Menz
*Assistant Examiner* — Candice Y Chen
(74) *Attorney, Agent, or Firm* — Liu & Liu

(57) ABSTRACT

The invention provides an electronic device package and fabrication method thereof. The electronic device package includes a sensor chip. An upper surface of the sensor chip comprises a sensing film. A covering plate having an opening structure covers the upper surface of the sensor chip. A cavity is between the covering plate and the sensor chip, corresponding to a position of the sensing film, where the cavity communicates with the opening structure. A spacer is between the covering plate and the sensor chip, surrounding the cavity. A pressure releasing region is between the spacer and the sensing film.

19 Claims, 8 Drawing Sheets

Related U.S. Application Data

(60) Provisional application No. 61/204,367, filed on Jan. 6, 2009.

(52) U.S. Cl.
CPC ........ *H01L 2221/68304* (2013.01); *H01L 2221/68331* (2013.01); *H01L 2221/68372* (2013.01); *H01L 2221/68377* (2013.01); *H01L 2221/68386* (2013.01); *H01L 2224/0239* (2013.01); *H01L 2224/02313* (2013.01); *H01L 2224/02371* (2013.01); *H01L 2224/0401* (2013.01); *H01L 2224/05548* (2013.01); *H01L 2224/11009* (2013.01); *H01L 2224/11019* (2013.01); *H01L 2224/1132* (2013.01); *H01L 2224/11462* (2013.01); *H01L 2224/11849* (2013.01); *H01L 2224/131* (2013.01); *H01L 2224/13024* (2013.01); *H01L 2224/29007* (2013.01); *H01L 2224/29011* (2013.01); *H01L 2224/2919* (2013.01); *H01L 2224/32225* (2013.01); *H01L 2224/8385* (2013.01); *H01L 2224/83191* (2013.01); *H01L 2224/93* (2013.01); *H01L 2924/0001* (2013.01); *H01L 2924/014* (2013.01); *H01L 2924/01013* (2013.01); *H01L 2924/01021* (2013.01); *H01L 2924/01029* (2013.01); *H01L 2924/01033* (2013.01); *H01L 2924/01047* (2013.01); *H01L 2924/01059* (2013.01); *H01L 2924/01075* (2013.01); *H01L 2924/10156* (2013.01); *H01L 2924/12041* (2013.01); *H01L 2924/14* (2013.01); *H01L 2924/1461* (2013.01); *H01L 2924/15151* (2013.01); *H01L 2924/15788* (2013.01)

(56) References Cited

U.S. PATENT DOCUMENTS

| | | |
|---|---|---|
| 6,432,737 B1 | 8/2002 | Webster |
| 7,781,250 B2 | 8/2010 | Wang et al. |
| 2009/0001553 A1 | 1/2009 | Pahl et al. |
| 2009/0263927 A1 | 10/2009 | Lin et al. |

FOREIGN PATENT DOCUMENTS

| | | |
|---|---|---|
| CN | 101276820 | 10/2008 |
| TW | 200740687 | 11/2007 |
| TW | 200827288 | 7/2008 |

METHOD FOR FABRICATING ELECTRONIC DEVICE PACKAGE

CROSS REFERENCE TO RELATED APPLICATIONS

This application is a Divisional of U.S. application Ser. No. 12/652,715, filed Jan. 5, 2010, which claims the benefit of U.S. Provisional Application No. 61/204,367 filed Jan. 6, 2009, the entirety of which is incorporated by reference herein.

BACKGROUND OF THE INVENTION

Field of the Invention

The present invention relates to an electronics package, and in particular relates to an electronics package and a method for fabricating an electronics package using a wafer level package process.

Description of the Related Art

Micro electro-mechanical systems (MEMS) are microdevices using semiconductor technology to integrate electronic and mechanical functions. MEMS products comprise accelerators, gyroscopes, pressure sensors, optical transmission devices, DLP (digital light processing) devices, ink printer heads and wireless network RF sensors. Currently, MEMS are applied in various products including tire pressure measurement systems, optical transmission networks, projectors, sensor networks, digital microphones, clock oscillators and game consoles. MEMS also play an important role in the development of research areas such as memory technology, biological chips, display technology and emerging energy. Pressure sensors are used for measuring a change in atmospheric pressure. Some pressure sensors applied in cars, for example, oil pressure gauges, are considered as being of very mature technology. However, pressure sensors, have the potential for new applications, such as in tire pressure gauges. Thus, an electronics package used in MEMSs and a method for fabricating the same are desired.

BRIEF SUMMARY OF THE INVENTION

An exemplary embodiment of a method for fabricating an electronic device package is provided. The method for fabricating an electronic device package, comprises: providing a wafer having an upper surface with a conductive electrode disposed thereon and a lower surface covering the upper surface of the wafer with a covering plate; covering the lower surface of the wafer with a passivation layer; forming conductive bumps on the passivation layer, electrically connected to the conductive electrodes; forming an opening structure on the covering plate, wherein the step of forming an opening structure is performed before the step of covering the upper surface of the wafer with the covering plate, or after the step of covering the lower surface of the wafer with the passivation layer and before the step of forming the conductive bumps.

An exemplary embodiment of an electronic device package is provided. The electronic device package, comprises: a sensor chip, wherein an upper surface of the sensor chip comprises a sensing film; a covering plate having an opening structure covering the sensor chip, wherein the covering plate and the sensor chip have a cavity therebetween, and the cavity is over a position corresponding to the sensing film, communicating with the opening structure; and a spacer between the covering plate and the sensor chip, surrounding the cavity, wherein the spacer and the sensing film have a pressure release region therebetween.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

A method for fabricating an electronic device package such as a pressure sensor is described. Embodiments of the electronic device packages of the invention may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer level packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

Figure 1A:
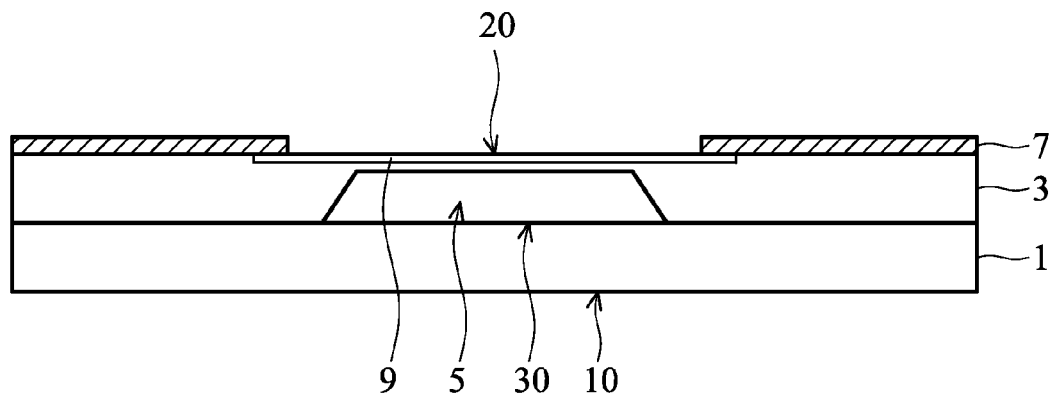
FIGS. 1A-1I are cross sections showing the steps for fabricating an electronic device package according to an embodiment of the invention.

FIGS. 1A-1I are cross sections showing the steps for fabricating an electronic device package 500a such as pressure sensor package according to an embodiment of the invention. As shown in FIG. 1A, a wafer 3 having an upper surface 20 and a lower surface 30 is provided, wherein a plurality of cavities 5 is formed on the lower surface 30 of the wafer 3, wherein the plurality of cavities 5 extend into the wafer 3. The cavities 5 are sealed by a carrier substrate 1 bonded to the lower surface 30 of the wafer 3. The carrier substrate 1 may comprise a glass substrate with a thickness of between about 300 µm and 500 µm, or preferably about 400 µm. In one embodiment, the wafer 3 may be formed of silicon or other materials having good thermal dissipation ability or a high thermal conductivity coefficient. The cavities 5 may be formed by etching the wafer 3 using a process such as a wet etching process. The wafer 3 may have a thickness of between about 100 µm and 200 µm, or preferably about 140 µm. In one embodiment, an adhesive such as epoxy may be used to bond the wafer 3 to the carrier substrate 1. However, the invention is not limited to thereto. In one embodiment, a plurality of micro electro-mechanical devices comprising sensor chips is disposed on the wafer 3. A sensor film 9, for example, a piezoelectrical material film, is formed in the wafer 3 and adjacent to the upper surface 20 of the wafer 3 to measure the changes in the surrounding environment or fluids. The sensor film 9 is surrounded by a conductive electrode or a conductive pad 7. As shown in FIG. 1A, the conductive electrode 7 connects to the sensor film 9 to transfer sensing signals of the sensor film 9. Alternatively, the sensor film 9 may be also formed on the upper surface 20 of the wafer 3, connecting to the conductive electrode 7. Also, the silicon wafer 3 and the conductive electrode 7 are separated by forming an insulating film (not shown), for example, forming a silicon oxide, silicon oxynitride or low dielectric constant material layer, therebetween.

Figure 1B:
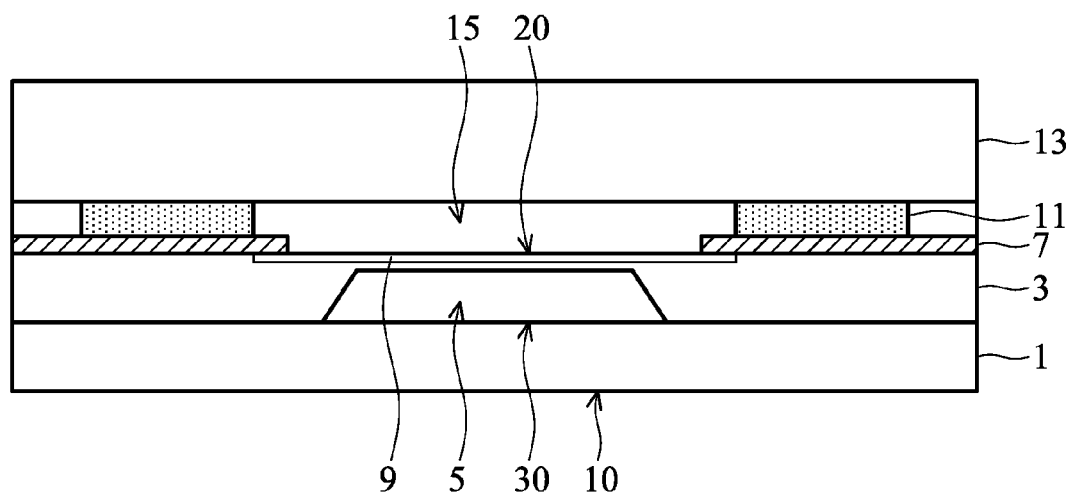

As shown in FIG. 1B, next, a packaging layer or a covering plate 13 may be formed on the upper surface 20 of the wafer 3. In one embodiment, a spacer 11 or a dam may be formed between the covering plate 13 and the conductive electrode 7, thereby forming a cavity 15 between the covering plate 13 and the sensor film 9. The spacer 11 surrounds the cavity 15. The covering plate 13 may comprise, for example, glass, quartz, opal or plastic. In this embodiment, the covering plate 13 is a silicon substrate. The covering plate 13 has an opening formed therein, for fluid to flow in and out of. The covering plate 13 may have a thickness of between about 500 µm and 800 µm, or preferably about 700 µm. The spacer 11 may comprise adhesive materials, for example, epoxy. Generally, the spacer 11 is on the conductive electrode 7.

Next, a step of thinning down the carrier substrate 1 may be optionally performed. For example, a backside 10 of the glass substrate 1 is thinned down to a preferred thickness, for example, from 400 µm to 120 µm, by an etching, milling, grinding or polishing process.

Figure 1C:
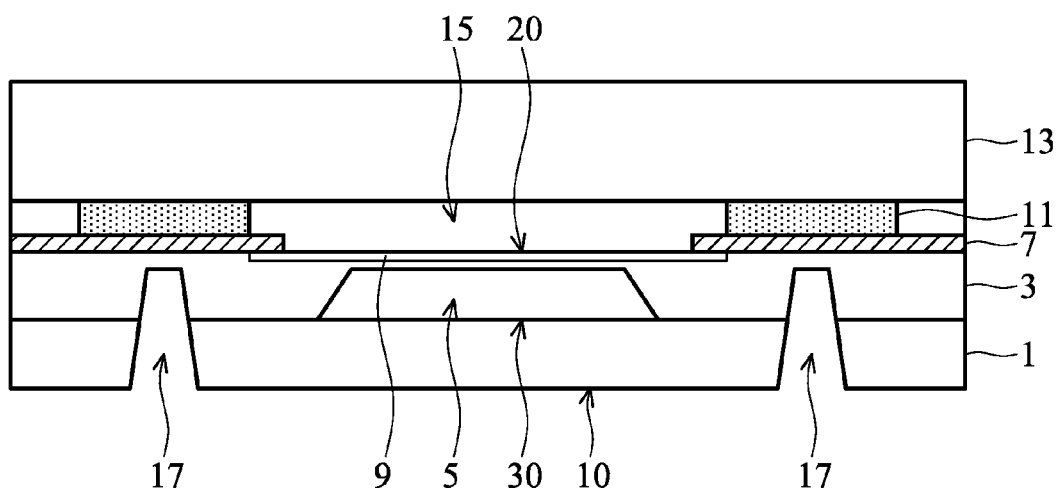

Next, referring to FIG. 1C, an opening 17 is formed at a position below a preferred scribe line or the conductive electrode 7, through the carrier substrate 1 and deep into a portion of the wafer 3. In one embodiment, a notching process may be performed by notch equipment. For example, a knife with a 60 degree cutting angle may cut the carrier substrate 1 and the wafer 3, to form the channel notch 17.

Figure 1D:
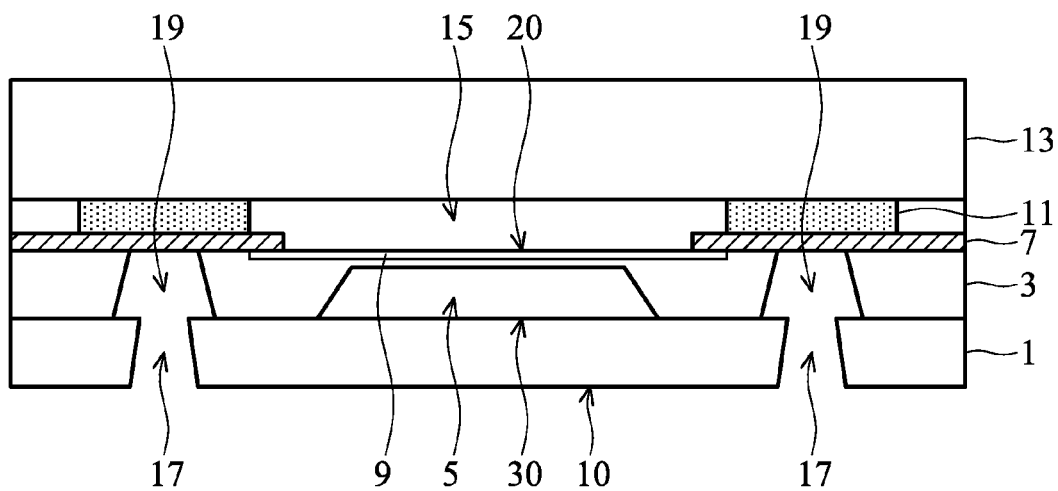

Next, as shown in FIG. 1D, the wafer 3 is etched along the opening 17 to form an opening 19 with a wide lower portion and a narrow upper portion. For example, a silicon etching process is performed on the silicon wafer 3 to remove the wafer material on the sidewalls and a bottom of the opening, wherein the insulating layer between the conductive electrode 7 and the wafer 3 may serve as an etching stop layer in this step.

Figure 1E:
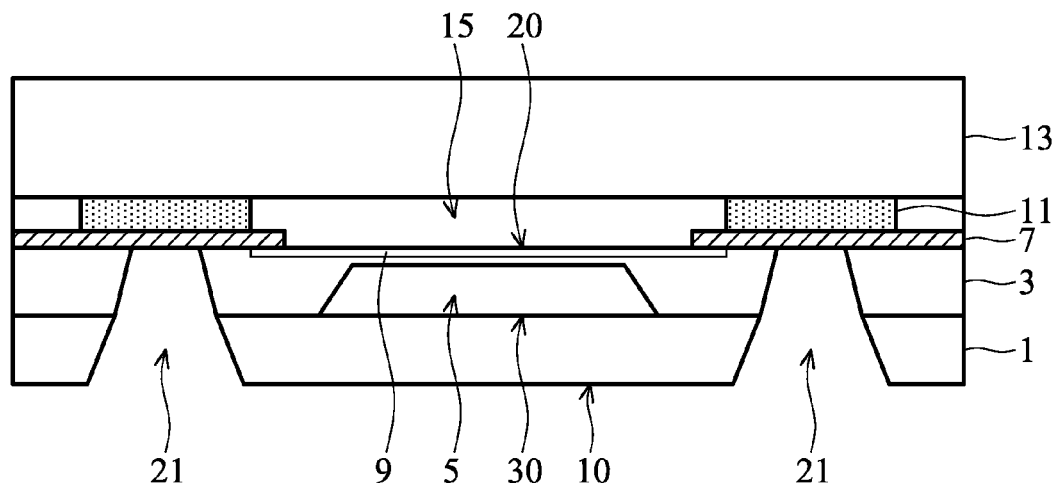

Referring to FIG. 1E, an opening 21 with a wide upper portion (a portion in the carrier substrate 1) and a narrow lower portion (a portion in the wafer 3) is formed at a position of the opening 19. A notching process may be performed by notch equipment to cut the carrier substrate 1, wherein the knife used in the notching process has a wide width or a large cutting angle. For example, a knife with a cutting angle larger than about 60 degrees is selected. Preferably, a knife with the cutting angle between about 75 and 80 degrees is selected. Therefore, the opening 21 has a wide upper portion (a portion in the carrier substrate 1) and a tilted angle of the wide upper portion is larger than the lower portion (a portion in the wafer 3), thereby facilitating deposition of a conductive line. Additionally, sidewalls of the upper portion (a portion in the carrier substrate 1) and the lower portion (a portion in the wafer 3) of the opening 21 are connected together, thereby preventing voids from being generated while filling in the insulating layer 23 as shown in FIG. 1F.

Figure 1F:
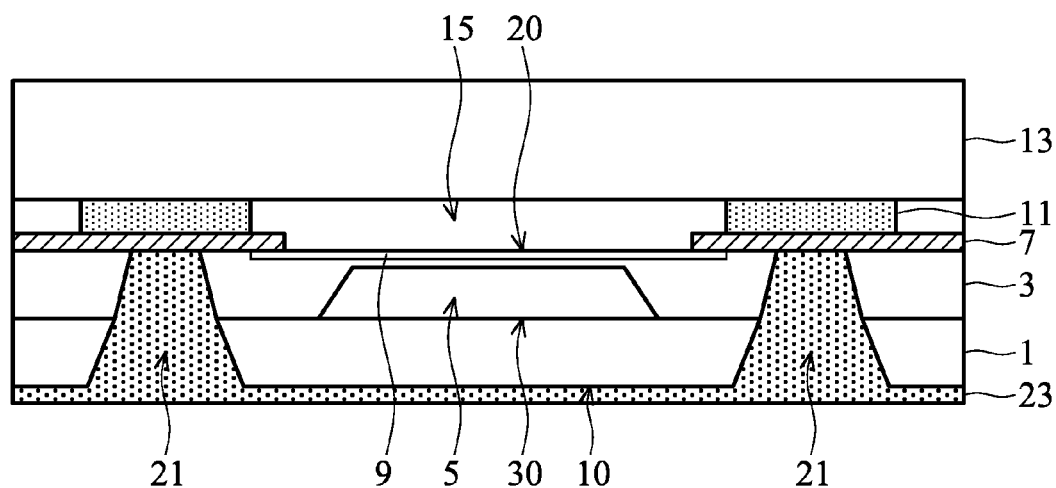

Referring to FIG. 1F, the insulating layer 23 is formed in the opening 21. In one embodiment, the insulating layer 23 is formed on the backside 10 of the carrier substrate 1, filling the opening 21. Preferably, the insulating layer 23 may be made of epoxy, solder mask or other suitable insulating materials, such as insulating deposited layers including non-organic materials comprising silicon nitride, silicon oxinitride, metal oxide or combinations thereof, or organic materials comprising polyimide, BCB™, parylene, polynaphthalenes, fluorocarbons or acrylates. The insulation layer is preferably formed by a coating method such as spin coating, spray coating or curtain coating, or may be formed by any suitable method, such as a liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition process.

Figure 1G:
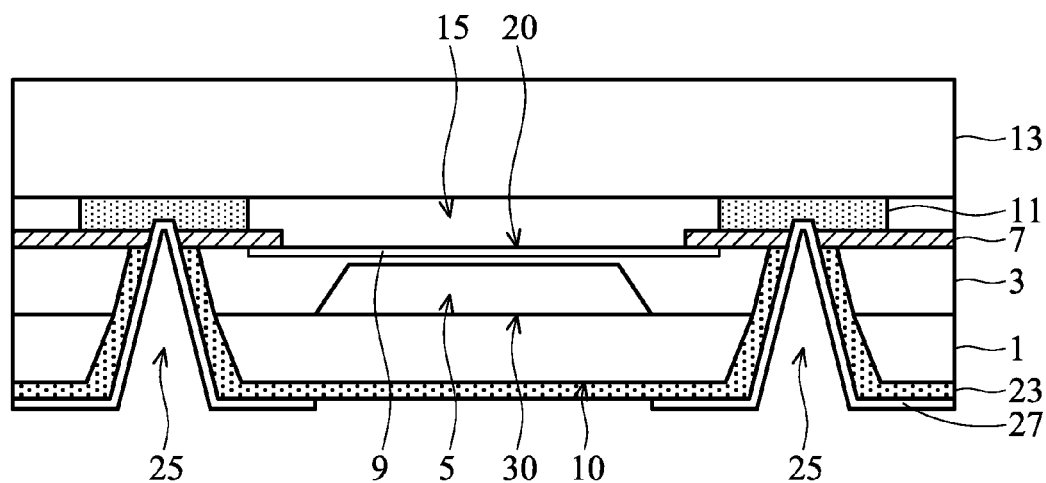

Next, referring to FIG. 1G, an opening 25, extending deep into the spacer 11, exposing the conductive electrodes 7, is formed. The insulating layer 23 and the insulating layer between the conductive electrodes 7 and the wafer 3 and a portion of the spacer 11 are patterned to form the opening 25 (not shown) by methods such as a photolithography/etching process. Alternatively, a notching process is performed by notch equipment to cut the insulating layer 23 and the conductive electrodes 7 to a portion of the spacer 11, thereby forming the opening 25 with exposed sides of the conductive electrode 7.

Next, a conductive layer 27 is formed on an inner sidewall and a lower portion of the opening 25, extended over a portion of the insulating layer 23 over the backside 10 of the carrier substrate 1, wherein the conductive layer 27 may electrically connect to the conductive electrode 7. In this embodiment, the conductive layer 27 electrically connects to sides of the conductive electrode 7. Alternatively, the conductive layer 27 may electrically connect to a lower surface of the conductive electrode 7. Generally, the conductive layer 27 may be a conductive material layer formed of Cu, Al, Ag, Ni or alloys thereof. The conductive material layer may be conformably formed on the backside 10 of the carrier substrate 1, extending to a tiled side and the lower portion of the opening 25 by using, for example, an electroplating or sputtering process. Next, a photolithography/etching process is performed to pattern the conductive material layer, thereby forming the conductive layer 27.

Figure 1H:
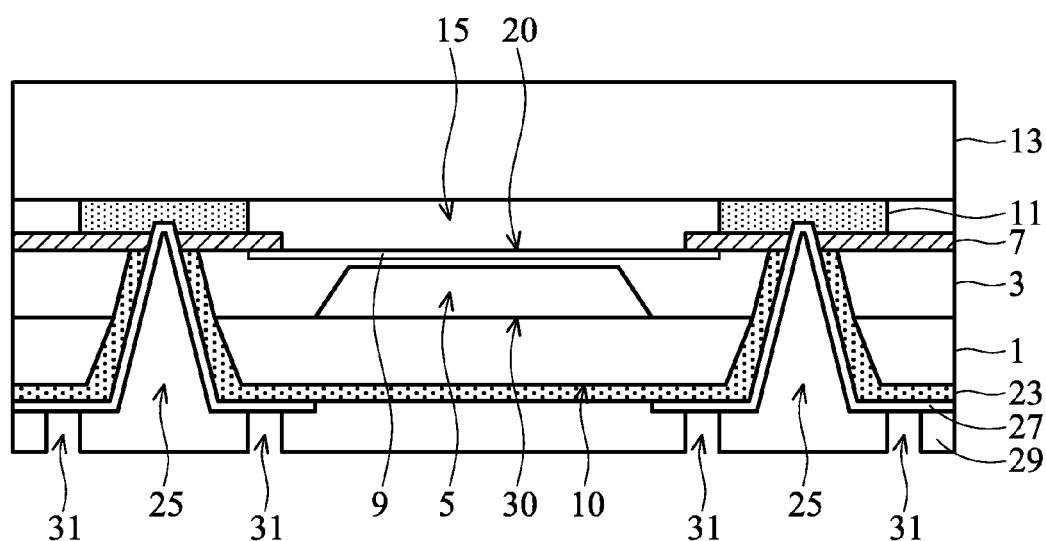

Next, as shown in FIG. 1H, a passivation layer 29 is formed on the conductive layer 27, covering the backside 10 of the carrier substrate 1 and filling the opening 25 after forming the conductive layer 27. The passivation layer 29 may be, for example, a solder mask. In one embodiment, the passivation layer 29 may be patterned to form openings 31 exposing a portion of the conductive layer 27 after the passivation layer 29 is formed.

Figure 1I:
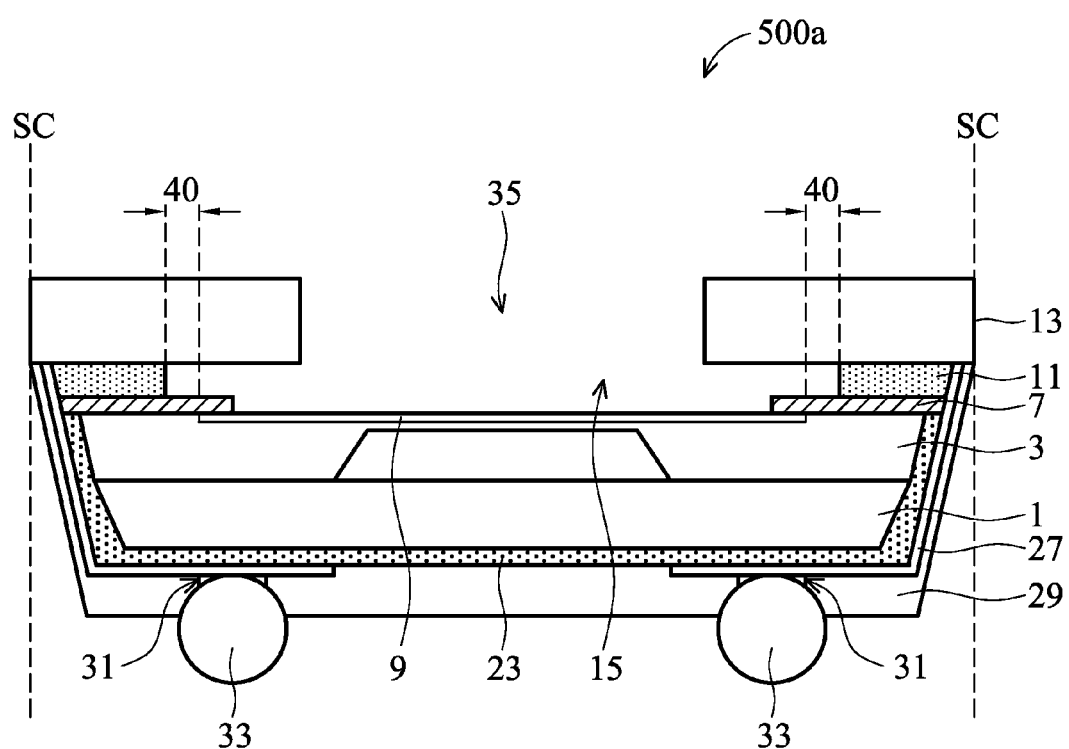

Next, referring to FIG. 1I, before forming conductive bumps 33, an opening 35 communicating with the cavity 15 is formed in the covering plate 13 and over a position corresponding to the sensing film 9, wherein the opening 35 may comprise a single opening or a porous structure to communicate with an outside fluid. Next, the covering plate 13 is thinned down. In one embodiment, an area of the sensing film 9 to an area of the opening 35 is equal to a ratio preferably of between about 1 and 1.5, thereby stabilizing and protecting the covering plate 13 while not affecting the sensing film 9 when the sensing film 9 senses fluid flowing through the opening 35. If the covering plate 13 is formed of silicon, the opening 35 can be formed by a dry etching process. Additionally, the spacer 11 and the sensing film 9 may further comprise a pressure release region 40 therebetween to prevent stress from transmitting from the covering plate 13 to the spacer 11, which may affect detection of the sensing film 9. For example, the spacer 11 and the sensing film may be horizontally separated by a default distance 40 larger than about 100 μm. Alternatively, one or more cavities may be formed on the silicon wafer horizontally between the spacer 11 and the sensing film 9 to prevent stress. Also, the cavities may be filled with buffer materials. Finally, conductive bumps 33 are formed on positions of the openings 31 to electrically connect to the conductive layer 27. In one embodiment, a solder is filled in the opening by an electroplating or screen printing process. A solder re-flow process is performed to form the conductive bumps 33 such as solder balls or solder pastes. Next, the wafer 3 is cut along scribe lines SC to be divided into several individual pressure sensing chips, to complete the formation of the electronic device package 500a.

In the aforementioned embodiments, the opening 35 of the covering plate 13 is exposed after the formation of the passivation layer 29, thereby preventing the sensing film 9 from being contaminated during processes performed before exposure of the covering plate 13. Also, the opening 35 is formed before the formation of the conductive bumps 33, thereby preventing the conductive bumps 33 from being damaged due to processes performed up to the formation of the opening 35.

Figure 2A:
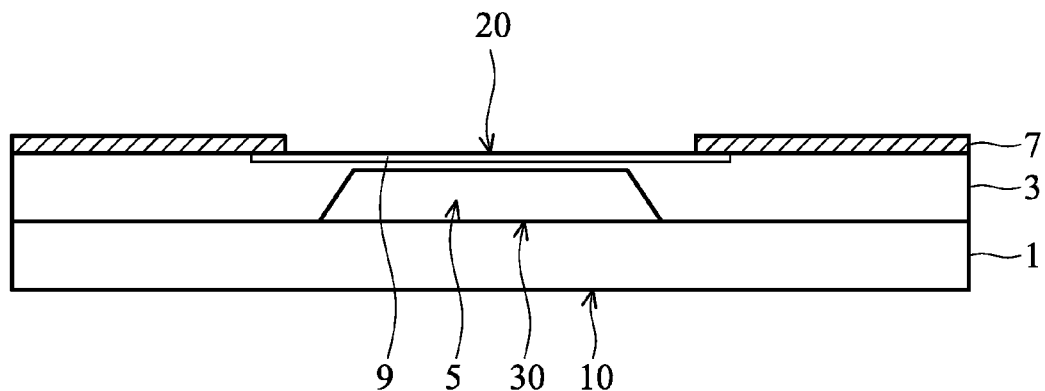
FIGS. 2A-2E are cross sections showing the steps for fabricating an electronic device package according to another embodiment of the invention.

FIGS. 2A-2E are cross sections showing the steps for fabricating an electronic device package 500b such as pressure sensor package according to another embodiment of the invention. As shown in FIG. 2A, a wafer 3 having an upper surface 20 and a lower surface 30 is provided, wherein a plurality of cavities 5 is formed on the lower surface 30 of the wafer 3, extending into the wafer 3. The cavities 5 are sealed by a carrier substrate 1 bonded to the lower surface 30 of the wafer 3. The carrier substrate 1 may comprise a glass substrate with a thickness of between about 300 μm and 500 μm, or preferably about 400 μm. In one embodiment, the wafer 3 may be formed of silicon or other materials having good thermal dissipation ability or a high thermal conductivity coefficient. The cavities 5 may be formed by etching the wafer 3 using methods such as a wet etching process. The wafer 3 may have a thickness of between about 100 μm and 200 μm, or preferably about 140 μm. In one embodiment, an adhesive such as epoxy may be used to bond the wafer 3 to the carrier substrate 1. However, the invention is not limited to thereto. In one embodiment, a plurality of micro electro-mechanical devices comprising sensor chips is disposed on the wafer 3. A sensor film 9, for example, a piezoelectrical material film, covers the upper surface 20 of the wafer 3 to sense changes in the surrounding environment or fluids. The sensor film 9 is surrounded by an electrode or a conductive pad 7 to transfer sensing signals of the sensor film 9. Also, the silicon wafer 3 and the conductive electrode 7 are separated by forming an insulating film (not shown), for example, forming a silicon oxide, silicon oxynitride or low dielectric constant material layer, therebetween.

Figure 2B:
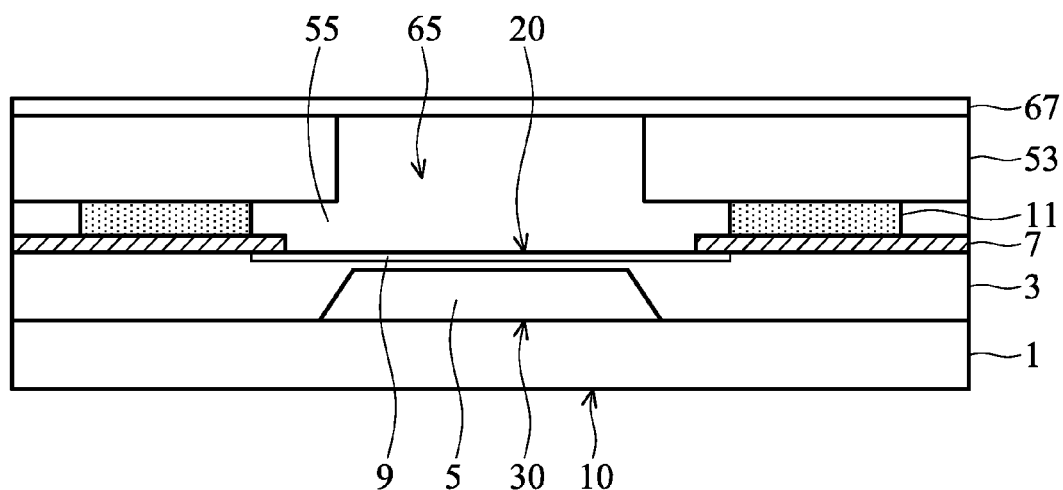

As shown in FIG. 2B, next, a packaging layer or a covering plate 53 may be formed on the upper surface 20 of the wafer 3. In one embodiment, a spacer 11 may be formed between the covering plate 53 and the conductive electrode 7, thereby forming a cavity 55. The spacer 11 surrounds the cavity 55. The covering plate 53 may comprise, for example, glass, quartz, opal or plastic. In this embodiment, the covering plate 53 is a silicon substrate. The covering plate 53 has an opening formed therein, for fluid to flow in and out of. The covering plate 53 may have a thickness of between about 200 μm and 400 μm, or preferably about 300 μm. The spacer 11 may comprise adhesive materials, for example, epoxy. Generally, the spacer 11 is on the conductive electrode 7. An opening 65 may be pre-formed in the covering plate 53 and sealed by pasting a sealing layer 67, such as an adhesive tape, to the opening 65. Next, the covering plate 53 is attached to the upper surface of the wafer 3 so that the cavity 55 may communicate the opening 65, wherein the opening 65 may be a single opening or a porous structure.

Next, a step of thinning down the carrier substrate 1 may be optionally performed. For example, a backside 10 of the glass substrate 1 is thinned down to a preferred thickness, for example, from 400 μm to 120 μm, by an etching, milling, grinding or polishing process.

Figure 2C:
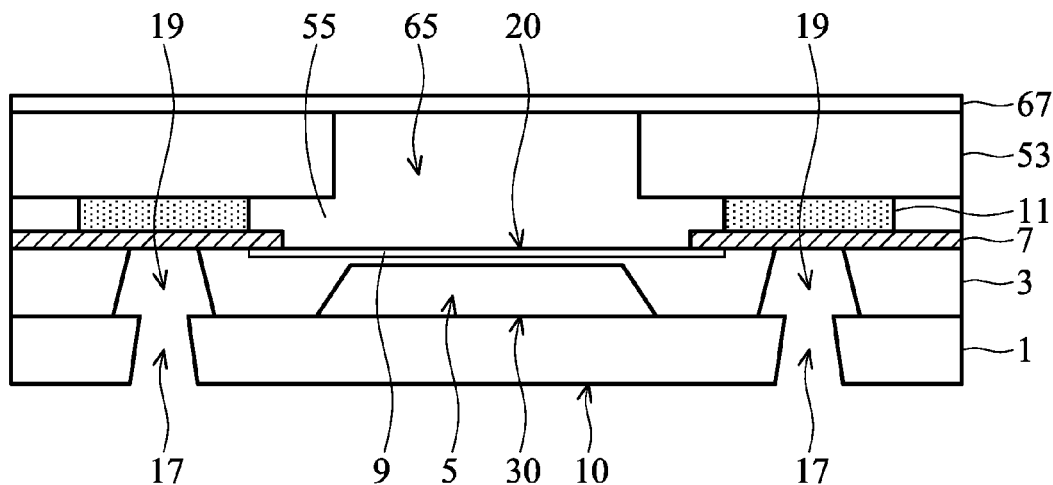

Next, referring to FIG. 2C, an opening 17 is formed at a position below the preferred scribe line or conductive electrode 7, through the carrier substrate 1, extending deep into the wafer 3. In one embodiment, a notching process may be performed by notch equipment. For example, a knife with a 60 degree cutting angle may cut the carrier substrate 1 and the wafer 3, to form the channel notch 17. Next, the wafer 3 is etched along the opening 17 to form an opening 19 with a wide lower portion. For example, a silicon etching process is performed on the silicon wafer 3 to remove the wafer material on the sidewalls and a bottom of the opening, wherein the insulating layer between the conductive electrode 7 and the wafer 3 may serve as an etching stop layer in this step.

Figure 2D:
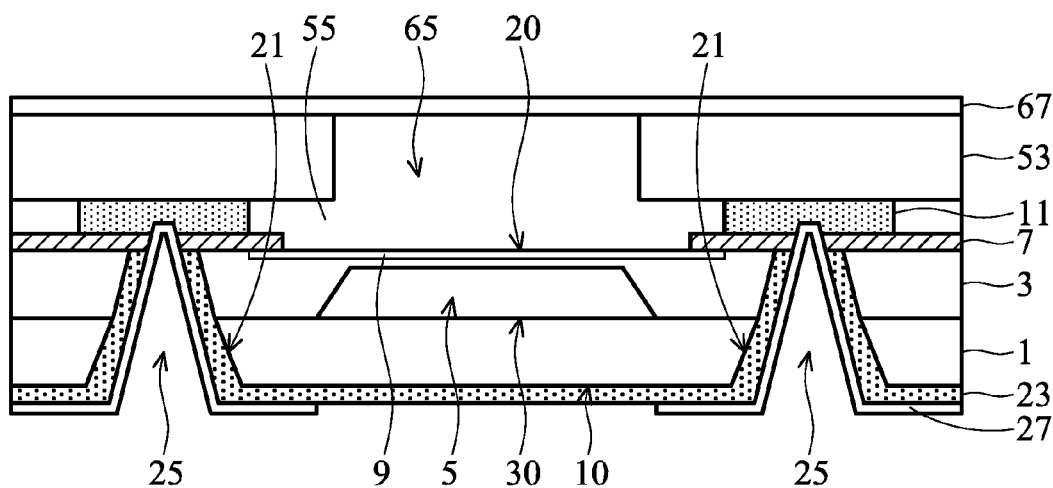

Referring to FIG. 2D, an opening 21 with a wide upper portion is formed at a position of the opening 19. A notching process may be performed by notch equipment to cut the carrier substrate 1, wherein the knife used in the notching process has a wide width or a large cutting angle. For example, a knife with the cutting angle larger than about 60 degrees is selected. Preferably, a knife with the cutting angle between about 75 and 80 degrees is selected. Therefore, the opening 21 has a wide upper portion (a portion in the carrier substrate 1) and a tilted angle of the upper portion is larger than the lower portion (a portion in the wafer 3), thereby facilitating conductive line deposition. Additionally, sidewalls of the upper portion (a portion in the carrier substrate 1) and the lower portion (a portion in the wafer 3) of the opening 21 are connected together, thereby preventing voids from being generated while filling the insulating layer 23. Next, the insulating layer 23 is formed in the opening 21. In one embodiment, the insulating layer 23 is formed on the lower surface of the carrier substrate 1, filling the opening 21. Preferably, the insulating layer 23 may be epoxy, solder mask or other suitable insulating materials, such as insulating deposited layers including non-organic materials comprising silicon nitride, silicon oxinitride, metal oxide or combinations thereof, or organic materials comprising polyimide, BCB™, parylene, polynaphthalenes, fluorocarbons or acrylates. The insulation layer is preferably formed by a coating method such as spin coating spray coating or curtain coating, or may be formed by any suitable method, such as, a liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition process.

Next, still referring to FIG. 2D, an opening 25, exposing the conductive electrode 7 is formed. The insulating layer 23 and the insulating layer between the electrodes and the wafer are patterned to form the opening 25 (not shown) by a method such as a photolithography/etching process. Alternatively, a notching process is performed by notch equipment to cut the insulating layer 23 and the conductive electrodes 7 to a portion of the spacer 11, thereby forming the opening 25, exposing the sides of the conductive electrode 7.

Next, a conductive layer 27 is formed on an inner sidewall and a lower portion of the opening 25, extending over the insulating layer over the lower surface of the carrier substrate 1, wherein the conductive layer 27 may electrically connect to the conductive electrodes 7. In this embodiment, the conductive layer 27 electrically connects to sides of the conductive electrode 7. Alternatively, the conductive layer 27 may electrically connect to a lower surface of the conductive electrode 7. Generally, the conductive layer 27 may be a conductive material layer formed of Cu, Al, Ag, Ni or alloys thereof. The conductive material layer may be conformably formed on the backside of the carrier substrate 1, extending to a tiled side and the lower portion of the opening 25 by using, for example, by an electroplating or sputtering process. Next, a photolithography/etching process is performed to pattern the conductive material layer, thereby forming the conductive layer 27.

Figure 2E:
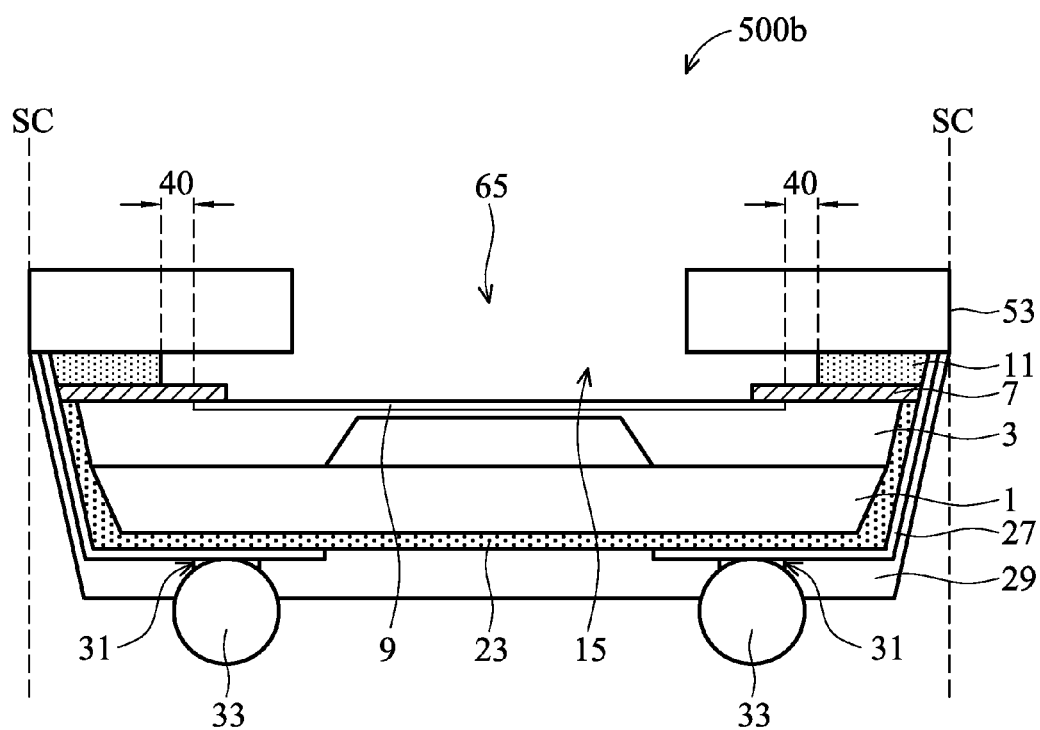

Next, as shown in FIG. 2E, a passivation layer 29 is formed on the conductive layer 27, covering the backside 10 of the carrier substrate 1 and filling the opening 25 after the conductive layer 27 is formed. The passivation layer 29 may be, for example, a solder mask. In one embodiment, the passivation layer 29 may be patterned to form openings 31 exposing a portion of the conductive layer 27 after the passivation layer 29 is formed.

Next, conductive bumps 33 are formed on positions of the openings 31 to electrically connect to the conductive layers 27. In one embodiment, a solder is filled into the opening by an electroplating or screen printing process. A solder re-flow process is performed to form the conductive bumps such as solder balls or solder pastes. After forming the conductive bumps, the adhesive tape 67 is removed to expose the opening 65, which is in the covering plate 13 and over a position corresponding to the sensing film 9, communicating with the cavity 55, wherein the opening may comprise a single opening or a porous structure to communicate with outside fluids. In one embodiment, an area of the sensing film 9 to an area of the opening 65 is equal to a ratio preferably of between about 1 and 1.5, thereby stabilizing and protecting the covering plate 53 while not affecting the sensing film 9 when the sensing film 9 senses fluid flows through the opening 65. Additionally, the spacer 11 and the sensing film 9 may further comprise a pressure release region 40 therebetween to prevent stress from transmitting from the covering plate 13 to the spacer 11, affecting the detection of the sensing film 9. For example, the spacer 11 and the sensing film may be horizontally separated by a default distance 40 such as a default distance larger than about 100 µm. Alternatively, one or more cavities may be formed on the silicon wafer horizontally between the spacer 11 and the sensing film 9 to prevent stress. Also, the cavities may be filled with buffer materials. Finally, the sealing layer 67 such as adhesive tape is torn, and the wafer is cut along scribe lines SC to divide the wafer into several individual pressure sensing chips, thus completing formation of the electronic device package 500b.

In the aforementioned embodiments, the opening 65 is firstly formed in the covering plate 53 and sealed by a sealing layer 67 such as an adhesive tape and then the covering plate 53 is attached to the wafer 3, thereby preventing the sensing film 9 from contamination during the fabricating process.

The exemplary embodiments of the electronic device package 500a pr 500b of the invention are fabricated by a wafer level package process. Therefore, the package may have a smaller size. Additionally, in the electronic device package, conductive layers or conductive bumps rather than bond wires are used to electrically connect to the electrodes of the semiconductor chip. Therefore, package size is further reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an electronic device package, comprising:
   providing a wafer;
   forming a sensor chip, wherein the sensor chip comprises a sensor chip body formed from the wafer, and a sensing film formed at an upper surface of the sensor chip body without any space between the sensing film and the upper surface of the sensing chip body, and wherein a lower surface of the sensor chip body defines a first cavity extending into the sensor chip body in a region below the sensing film;
   providing a covering plate having an open structure covering the sensor chip, wherein the covering plate and the sensor chip have a second cavity therebetween, and wherein the second cavity is over a position corresponding to the sensing film, communicating with the opening structure, and wherein the first cavity and the second cavity are separated by the sensor chip body; and
   providing a spacer between the covering plate and the sensor chip, surrounding the second cavity, wherein the spacer is horizontally separated from the sensing film by a pressure release region therebetween, and wherein the spacer does not include a cantilevered portion extending towards the second cavity.

2. The method as in claim 1, wherein a conductive electrode is disposed on the upper surface of the sensor chip body, between the spacer and the sensor chip.

3. The method as claimed in claim 1, wherein the spacer and the sensing film are separated by a default distance.

4. The method as claimed in claim 1, wherein the covering plate is a silicon substrate.

5. The method as claimed in claim 1, wherein the opening structure comprises a single opening or a porous structure.

6. The method as claimed in claim 1, wherein the first cavity is sealed by a carrier substrate bonded to the lower surface of the sensor chip body.

7. The method as claimed in claim 1, further comprising:
disposing an insulating layer having a portion formed below the lower surface of the sensor chip body and a portion formed on a sidewall of the sensor chip body;
forming a conductive layer on the portion of the insulating layer on the sidewall of the sensor chip body, extending over a part of the portion of the insulating layer below the lower surface of the sensor chip body, wherein the conductive layer electrically connects to a conductive electrode;
disposing a passivation layer covering below the lower surface of the sensor chip body; and
forming a conductive bump on the passivation layer, electrically connected to the conductive electrode.

8. The method as claimed in claim 7, wherein the passivation layer is formed on the conductive layer.

9. The method as claimed in claim 1, wherein an area of the sensing film to an area of the opening structure is equal to a ratio of between 1 and 1.5.

10. The method as claimed in claim 1, wherein the spacer is horizontally separated from the sensing film along a direction in a plane parallel to the upper surface of the sensor chip body.

11. The method as claimed in claim 1, wherein the sensor film extends across the upper surface of the sensor chip body at least over the region above the first cavity.

12. The method as claimed in claim 11, wherein the sensor film extends across the upper surface of the sensor chip body at least over an entire region above the first cavity.

13. The method as claimed in claim 12, wherein the sensor film completely extends over the upper surface of the sensor chip body at least over the entire region above the first cavity.

14. The method as claimed in claim 13, wherein an entire lower surface of the sensor film completely contacts the upper surface of the sensor chip body.

15. The method as claimed in claim 7, wherein the passivation layer covers over the conductive layer and a part of the insulating layer below the lower surface of the sensor chip body over which the conductive layer does not extend.

16. The method as claimed in claim 7, further comprising providing a carrier substrate supporting the sensor chip, wherein the portion of the insulating layer below the lower surface of the sensor chip body is formed below a lower surface of the carrier substrate, and the portion of the insulating layer on the sidewall of the sensor chip body is also formed on a sidewall of the carrier substrate, and the conductive layer is formed on the portion of the insulating layer on the sidewalls of the sensor chip body and a part of the portion of the insulating layer below the lower surface of the carrier substrate.

17. The method as claimed in claim 16, wherein the passivation layer covers over the conductive layer and a part of the insulating layer below the lower surface of the carrier substrate over which the conductive layer does not extend.

18. The method as claimed in claim 1, wherein the sensor film does not extend across the entire upper surface of the sensor chip body.

19. The method as claimed in claim 1, wherein the first cavity does not extend through the sensor chip body.

* * * * *